(12) United States Patent
Celano

(10) Patent No.: US 12,710,466 B2
(45) Date of Patent: Aug. 18, 2026

(54) SYSTEMS AND METHODS FOR CARVING PROBED METROLOGY

(71) Applicant: Umberto Celano, Scottsdale, AZ (US)

(72) Inventor: Umberto Celano, Scottsdale, AZ (US)

(73) Assignee: Arizona Board of Regents on Behalf of Arizona State University, Tempe, AZ (US)

( * ) Notice: Subject to any disclaimer, the term of this patent is extended or adjusted under 35 U.S.C. 154(b) by 186 days.

(21) Appl. No.: 18/814,499

(22) Filed: Aug. 24, 2024

(65) Prior Publication Data

US 2025/0067791 A1 Feb. 27, 2025

Related U.S. Application Data

(60) Provisional application No. 63/534,422, filed on Aug. 24, 2023.

(51) Int. Cl.
*G01R 31/26* (2020.01)
*H10P 74/20* (2026.01)

(52) U.S. Cl.
CPC ........ *G01R 31/2648* (2013.01); *H10P 74/207* (2026.01)

(58) Field of Classification Search
CPC ............ G01R 1/06727; G01R 1/07342; G01R 1/07314; G01R 1/07378; G01R 1/06733; G01R 1/07307; G01R 1/06711; G01R 1/073; G01R 1/06738; G01R 1/06716; G01R 1/067; G01R 1/06722; G01R 31/2863; G01R 31/26; G01R 1/0675; G01R 1/0416; G01R 31/2853; G01R 1/04; G01R 31/303; H01R 13/2407; H01R 12/57; H01R 12/714; H01R 13/2442; H01R 13/24; H01R 12/724; H01R 13/2414; H01R 12/91; H01R 13/2428; H01R 13/6582; H01R 13/02
See application file for complete search history.

(56) References Cited

U.S. PATENT DOCUMENTS 6,504,223 B1 * 1/2003 Zhou .................. H01R 13/2428 257/E23.021
6,778,406 B2 * 8/2004 Eldridge ............. H05K 7/1069 257/E21.507
8,191,246 B1 * 6/2012 Luo ..................... H10W 70/093 29/874

OTHER PUBLICATIONS

Mitta, S. B. et al., "Electrical characterization of 2D materials-based field-effect transistors," 2D Materials, vol. 8, No. 1, Nov. 19, 2020, 29 pages.

* cited by examiner

*Primary Examiner* — Vinh P Nguyen
(74) *Attorney, Agent, or Firm* — Polsinelli PC

(57) ABSTRACT

An apparatus includes a body and a plurality of members extending from the apparatus configured to form carvings with different geometries along 2D layered semiconductor material. The apparatus includes conductive pins positioned along the plurality of members that accommodate individual sensing of current-voltage characteristics per carving. The carvings can include small stripes and the apparatus can probe the electrical resistance of the small stripes of 2D layered semiconductors where the geometry defines strong current confinement, thus enabling the rapid extraction of sheet resistance for rapid comparison between material quality.

19 Claims, 6 Drawing Sheets

SYSTEMS AND METHODS FOR CARVING PROBED METROLOGY

CROSS REFERENCE TO RELATED APPLICATIONS

This is a non-provisional application that claims benefit to U.S. Provisional Application Ser. No. 63/534,422, filed on Aug. 24, 2023, which is herein incorporated by reference in its entirety.

FIELD

The present disclosure generally relates to semiconductors and associated processing technologies; and in particular to an apparatus and associated methods for rapid qualification of electrical properties in two-dimensional (2D) layered semiconductors using carved probes metrology.

BACKGROUND

The semiconductor industry (including associated fields) and academia have recently reported in prominent forums that some participants are seriously considering incorporating 2D layered semiconductors as channel materials into high volume manufacturing (HVM) within the next ten years. However, before 2D materials can be used in industry-relevant applications, there is a need to develop methodologies for screening key physical properties that impact devices. These properties include material quality, coverage, uniformity, defectivity, stacking order and orientation, layer numbers, contaminations, and interface control. Currently, this lab-to-fab transition is in the early stages, and there are significant gaps in the space of characterization methods required for monitoring and tuning of these properties in mass produced devices.

It is with these observations in mind, among others, that various aspects of the present disclosure were conceived and developed.

BRIEF DESCRIPTION OF THE DRAWINGS

Corresponding reference characters indicate corresponding elements among the view of the drawings. The headings used in the figures do not limit the scope of the claims.

DETAILED DESCRIPTION

The present disclosure relates to a system including an apparatus that can define a probe for measuring electrical properties such as the resistivity of two-dimensional (2D) materials or other ultra-thin blanket films. In some examples, the probe can be designed to punch a plurality of carving shapes such as rectangular strips with different aspect ratios into the 2D material. Each strip can be contacted by a respective probe member, allowing for the current-voltage characteristics of each rectangle to be measured. Because the shape of each strip limits the current characteristics, the sheet resistivity can be quickly deduced. The probe can carve the 2D material without needing additional lithography steps. Also, the resistivity values can be extracted in atomically thin layers, where other methods are not effective. In other words, the inventive concept described herein is rapid and can be lithography-free with ample possibilities for automation and wafer scale applicability.

Figure 1A:
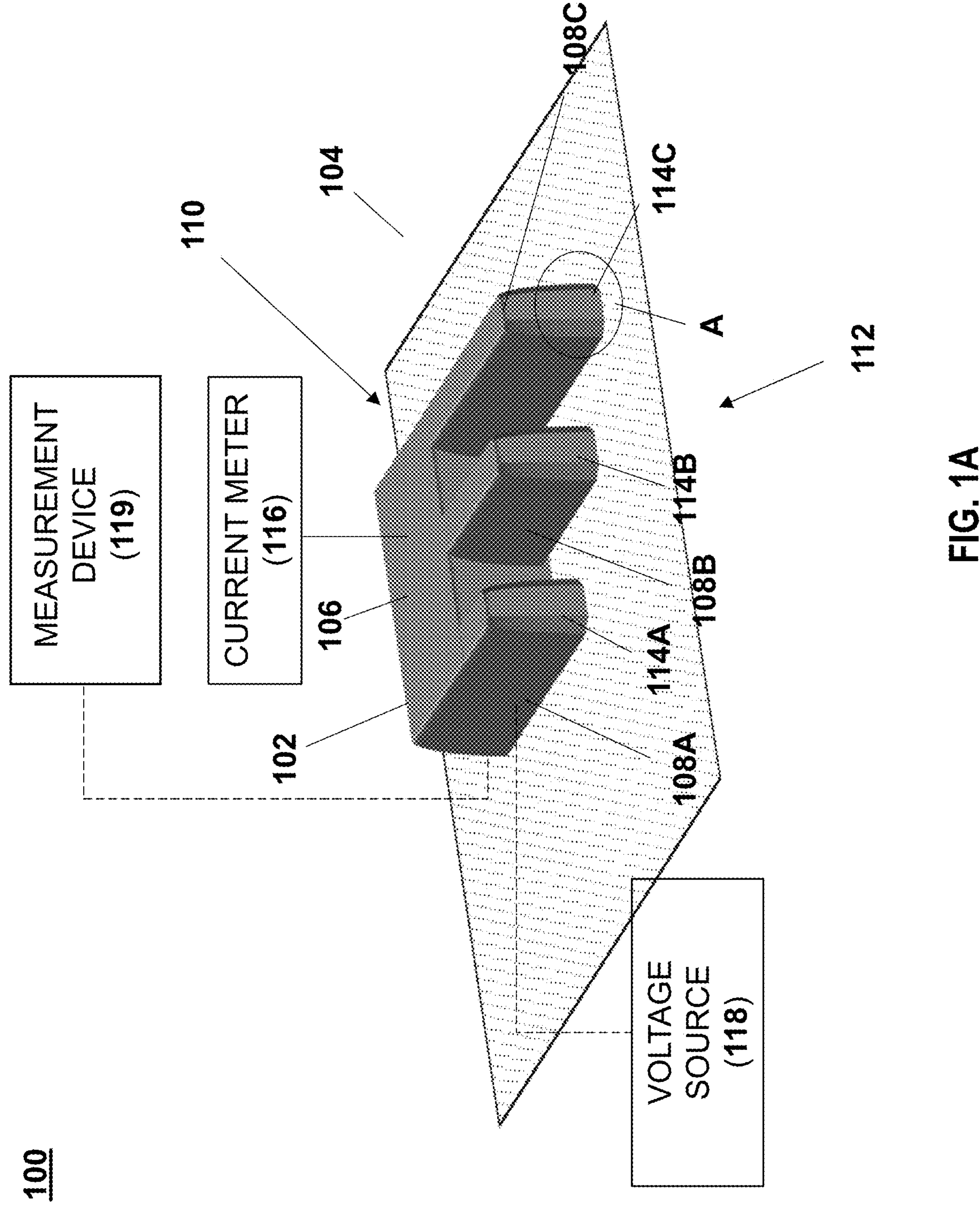
FIG. 1A is an isometric view of an apparatus for rapid extraction of electrical properties such as resistivity values from blanket films of 2D materials.
Figure 1B:
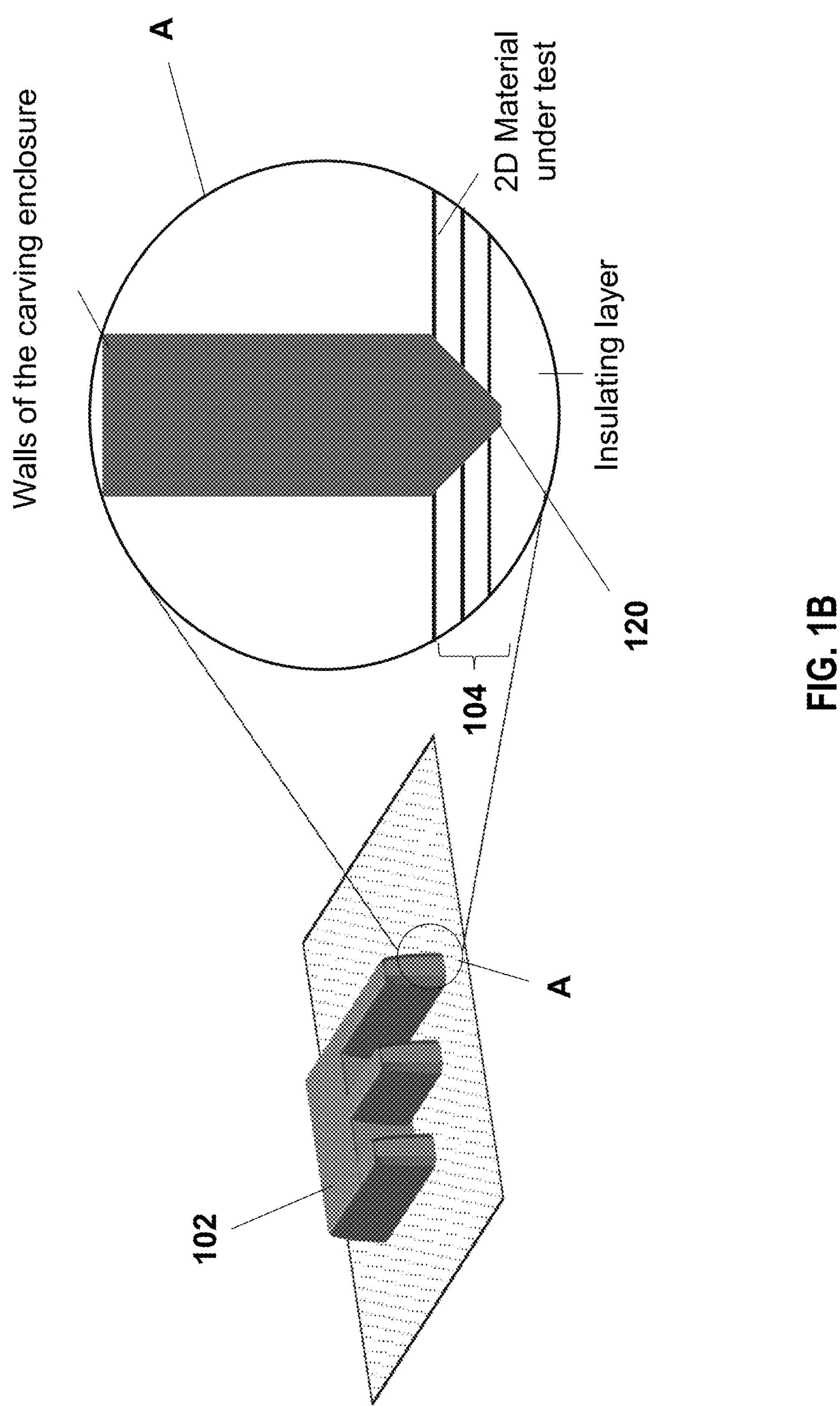
FIG. 1B is a sectional view of the apparatus of FIG. 1A illustrating additional detail within the area A.

Referring to FIGS. 1A-1B, a system 100 is shown including an example apparatus 102 for rapid extraction of electrical properties such as resistivity values from blanket films of 2D materials formed along a substrate. In general, the apparatus 102 includes a body 106 configured to engage a substrate 104 including 2D materials under test. The apparatus 102 further includes a plurality of members 108 extending from the body 106, the plurality of members including a first side 110 in communication with the body 106 and a second side 112 opposite the first side 110 defining a free end 114. In other words, each member of the plurality of members 108 defines a respective free end 114. As indicated in FIG. 1A, free ends 114 are designated by free end 114A, free end 114B, and free end 114C, defined respectively along member 108A, member 108B, and member 108C of the plurality of members 108. As indicated, each of the plurality of members 108 defines a different respective geometric shape configuration. Put simply, each member 108 can include a different shape, length, and/or width relative to the body 106.

As further shown, the system 100 can further include a current meter 116 and a voltage source 118. In some examples, the apparatus 102 can be implemented as part of a measurement device 119. For example, the apparatus 102 can define a probe and can be used inside a novel standalone metrology tool for the qualification of 2D materials, directly after growth with large reduction in time and money needed for the additional fabrication steps required to perform traditional characterization. The probe could be implemented into and existing 4PP tool to extend the sensitivity of the method and add more information on the material under study. Finally, the probe could be sold as an single element for other scholar to use it in their own electrical setup. In other words, numerous possible non-limiting applications and/or implementations of the apparatus 102 are contemplated.

Figure 2:
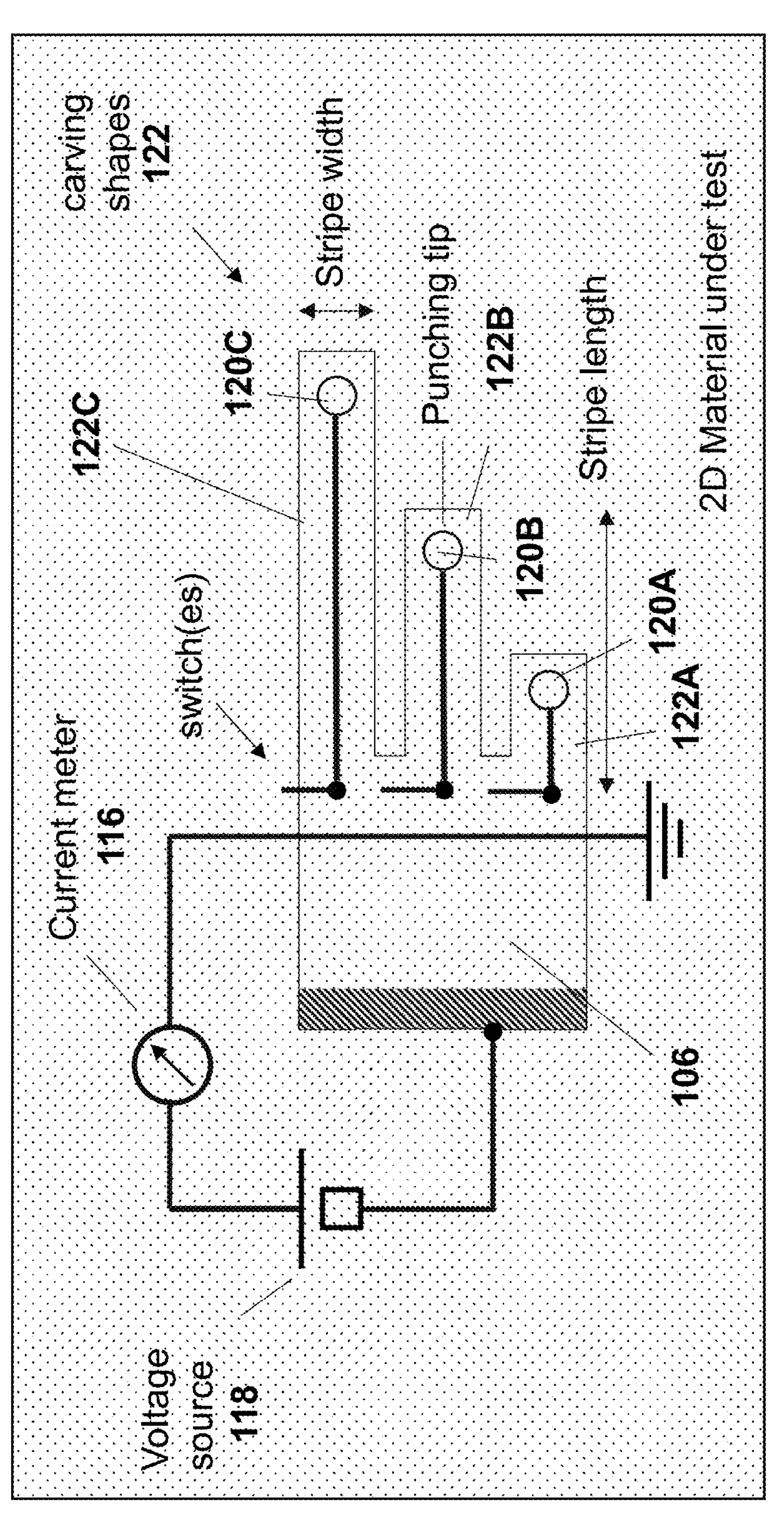
FIG. 2 is a top view of the apparatus of FIG. 1A illustrating implementation of the members and respective punching tips to form corresponding carving shapes within 2D materials to accommodate electrical properties testing as described herein.
Figure 3:
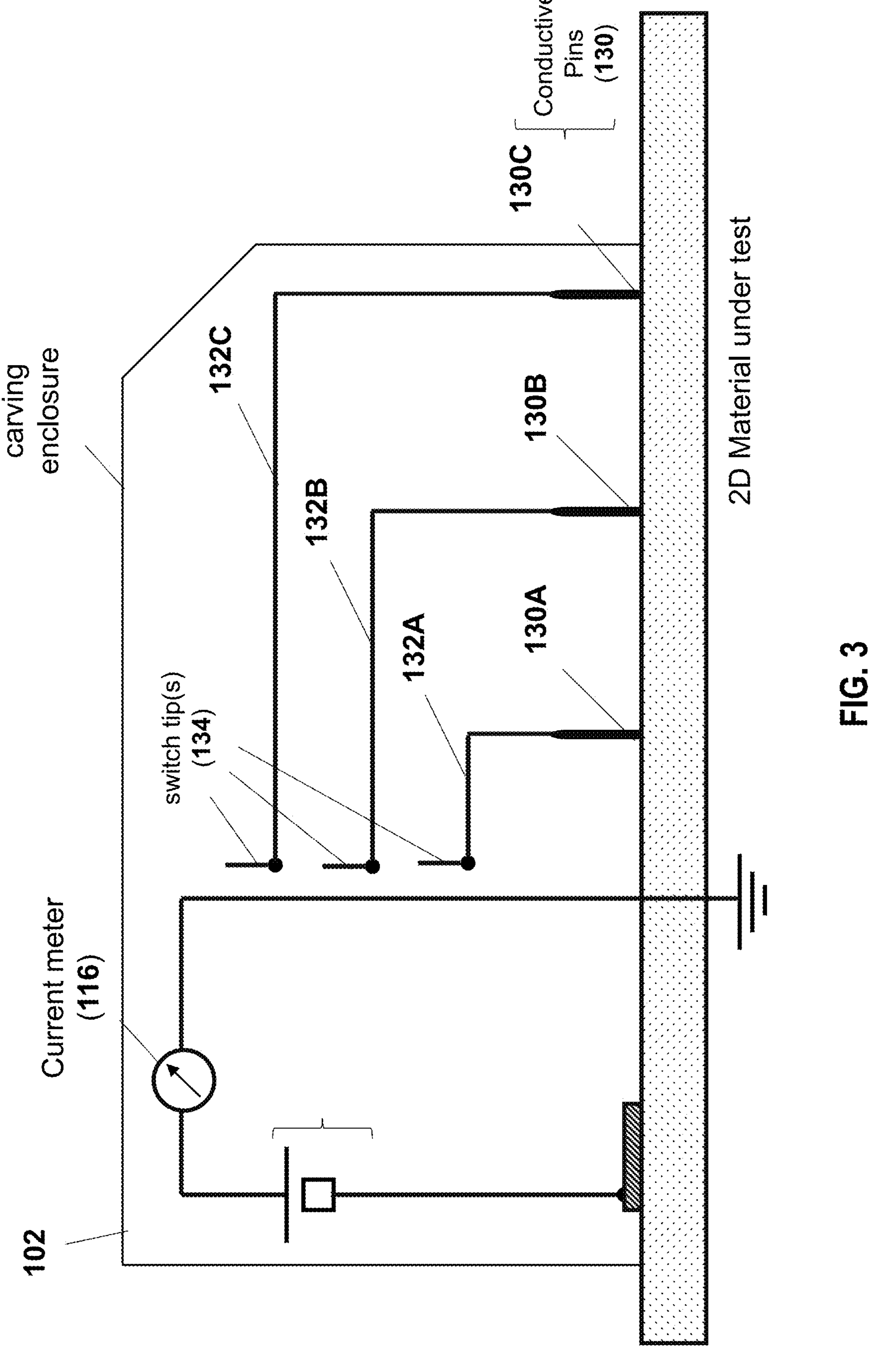
FIG. 3 is side view of the apparatus of FIG. 1A illustrating conductive pins corresponding to respective members as described herein.
Figure 4:
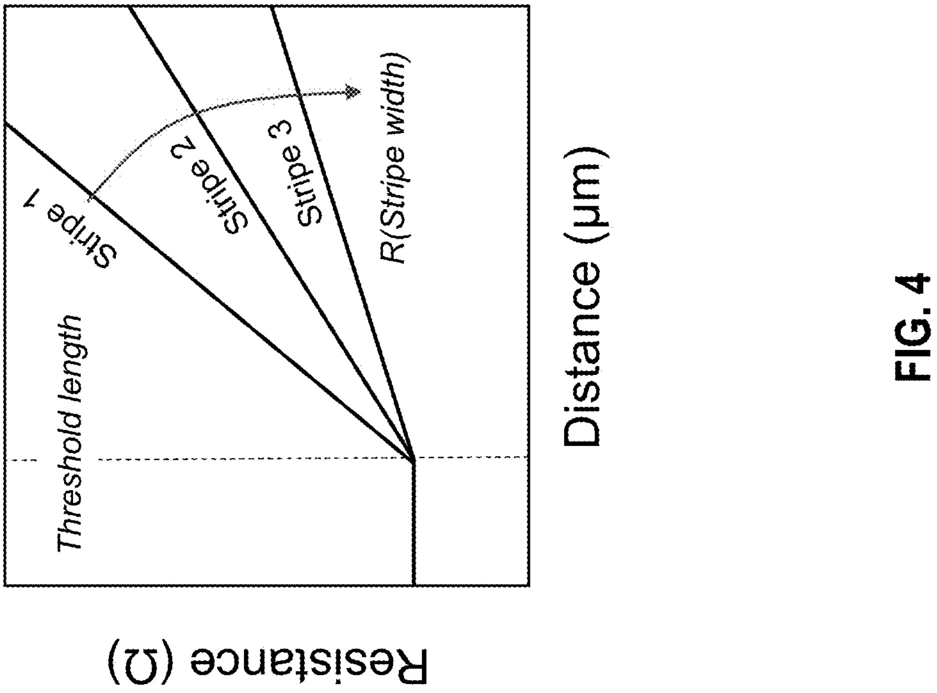
FIG. 4 is an illustration of the fast analysis of 2D materials or equally applicable to thin silicon (Si), and fully depleted silicon on insulator (SOI) layers described herein.

Referring to FIGS. 2-3 and also illustrated in FIG. 1B, the apparatus 102 can include a plurality of punching tips 120. Specifically, each of the plurality of members 108 defines a respective punching tip 120 defined along the free end 114 and configured to form carving shapes (122 in FIG. 2) corresponding to the respective geometric shape configuration of each member 108. More specifically, punching tips 120 are designated as punching tip 120A, punching tip 120B, and punching tip 120C and a position of each punching tip 120 relative to the body 106 corresponds to the unique shape configuration of each respective member 108. The carving shapes 122 indicated and designated as carving shape 122A, carving shape 122B, and carving shape 122C can include stripes, slits, or groves formed by the (probe) apparatus 102 as described herein.

In addition, as indicated in FIG. 3, the apparatus 102 can include a plurality of conductive pins 130. In some examples, each of the plurality of members 108 includes a respective conductive pin 130 positioned relative to the body 106 in accordance with the respective geometric shape configuration of the member 108. Conductive pins 130 are designated in FIG. 3 as conductive pin 130A, conductive pin 130B, and conductive pin 130C. In some examples, the plurality of conductive pins 130 accommodates probing of electrical resistance of 2D semiconductor materials of the substrate 104 along the carving shapes 122 thus providing individual sensing of current-voltage characteristics per each carving.

Further, the apparatus 102 can include at least one conductive layer (132) configured to distribute electrical connection between, e.g., switches or switch tips (134) and the conductive pins 130. In some examples, the at least one conductive layer 132 can electrically connect the plurality of conductive pins 130 with, e.g., the current meter to test at least one electrical property of the substrate 104.

The unique arrangement of the members 108 and other components of the apparatus 102 accommodate extraction of one or more electrical properties such as resistivity values in atomically thin layers. In some examples, based on an aspect ratio associated with a given carving shape of the carving shapes 122, measurements of a total resistance is dominated by material Resistivity (ρ) after a threshold length of the carving shape. In some examples, the carving shapes 122 define different aspect ratios and accommodate testing of the integrality of the relationship between resistivity and a length (L) of each of the carving shapes 122 expected to be inversely proportional (ρ~1/L). In some examples, the apparatus 102 includes a carving enclosure that at least partially encloses the plurality of conductive pins 130. In some examples, the at least one electrical property includes an extraction of resistivity values associated with each of the plurality of conductive pins 130.

The apparatus 102 is a non-limiting example of the present inventive concept. When positioned along or landed on 2D layered semiconductor material the apparatus 102 can carve a plurality (e.g., 3) of carving shapes 122 such as rectangles on the material with different geometries. Inside the apparatus 102, three of the conductive pins 130 can be positioned in correspondence of each of the rectangles, thus enabling 3 individual sensing of current-voltage characteristics, one per rectangle. The "carving probe" characteristics provided by the apparatus 102 is based on the idea to probe the electrical resistance of small stripes of 2D layered semiconductors where the geometry defines strong current confinement, thus enabling the rapid extraction of sheet resistance for rapid comparison between material quality. Stripes of different length (see FIG. 2) can be carved in the atomically thin 2D layered semiconductors by the apparatus 102 itself when pushed on a sample' surface. Based on the stripe's aspect ratio, the measurements of the total resistance will be dominated by the material Resistivity (ρ) after a threshold length of the stripe. Here, multiple stripes of different aspect ratios can be used to check the integrality of the relationship between resistivity and stripes length (L) expected to be inversely proportional (ρ~1/L). Assuming, the thickness of the 2D layered materials constant along the length of the stripe, the resistivity and sheet resistance can be easily exchanged by knowing the material thickness, thus making the method useful to extract sheet resistance as well.

The present inventive concept includes various methods and examples of an apparatus for the rapid qualification of electrical properties in 2D layered semiconductors. The apparatus can provide a probe to be used for the extraction of resistivity values in atomically-thin layers, where other methods are not effective. The disclosure includes a direct method for the qualification of electrical properties of 2D materials at an early stage of the manufacturing process. One purpose is the implementation of a rapid, automated, and lithography-free characterization method for the early screening of electrical parameters in 2D layered semiconductors.

The apparatus and methods described herein can be used in conjunction with methods described by Mitta et al. (Sekhar Babu Mitta et al 2021 *2D Mater.* 8 012002); available at https://doi.org/10.1088/2053-1583/abc187 and incorporated herein by reference in its entirety.

Figure 5:
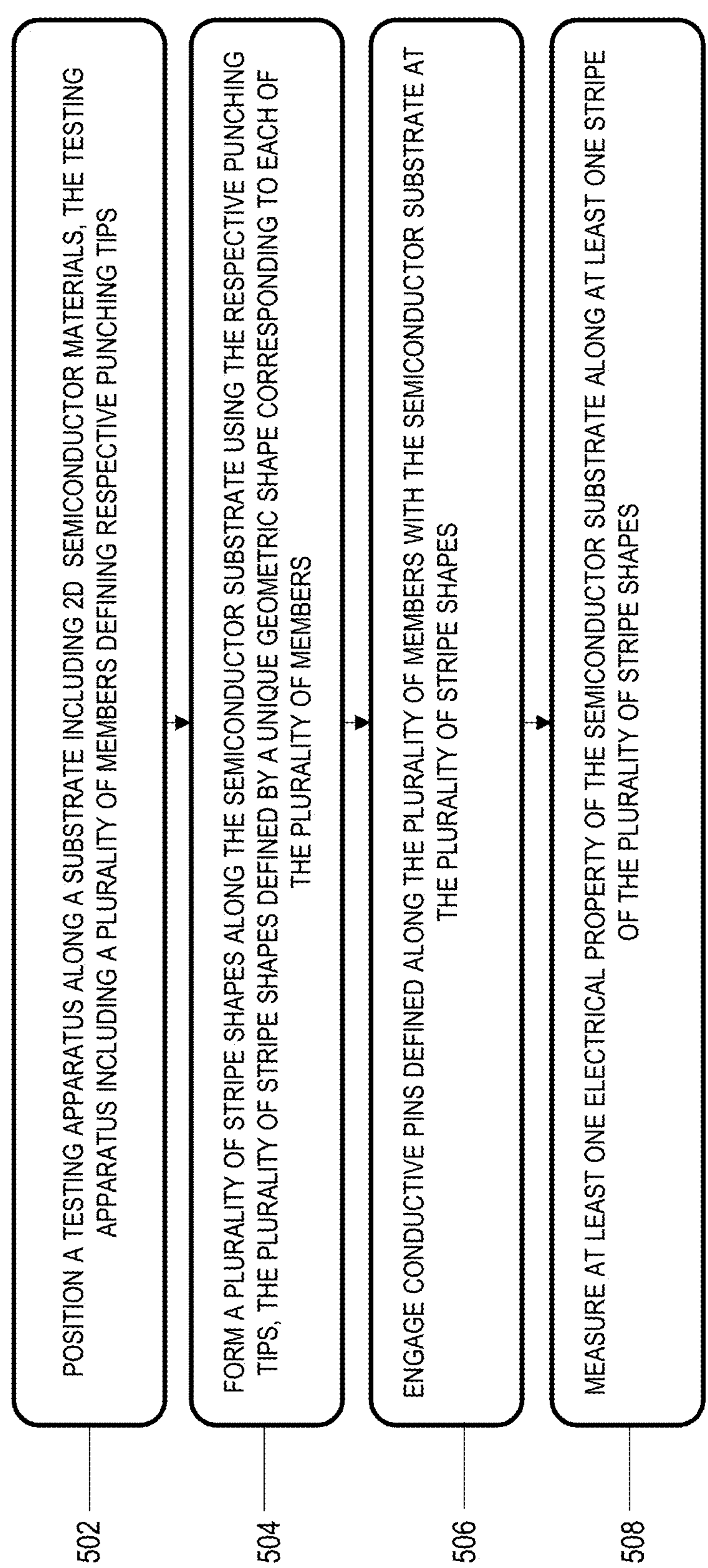
FIG. 5 is a simplified block diagram of an example method associated with the inventive concept described herein.

Referring to FIG. 5, one example method (500) of testing resistivity values in semiconductors during manufacturing can include steps of: positioning a testing apparatus along a semiconductor substrate, the testing apparatus including a plurality of members defining respective punching tips (as shown in block 502); pushing the respective punching tips of the plurality of members of the testing apparatus against the semiconductor substrate (as shown in block 504); carving a plurality of stripe shapes along the semiconductor substrate, the plurality of stripe shapes defined by a unique geometric shape corresponding to each of the plurality of members (as shown in block 506); and measuring at least one electrical property of the semiconductor substrate along at least one stripe of the plurality of stripe shapes (as shown in block 508).

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

What is claimed is:

1. An apparatus for rapid qualification of electrical properties in semiconductors, comprising:

a body configured to engage a substrate;

a plurality of members extending from the body, the plurality of members including a first side in communication with the body and a second side opposite the first side defining a free end, each of the plurality of members defining a different respective geometric shape configuration;

a plurality of punching tips, each of the plurality of members defining a respective one of the plurality of punching tips along the free end and configured to form carving shapes corresponding to the respective geometric shape configuration;

a plurality of conductive pins, each of the plurality of members including a respective one of the plurality of conductive pins positioned relative to the body in accordance with the respective geometric shape configuration; and at least one conductive layer configured to electrically connect the plurality of conductive pins with a current meter to test at least one electrical property of the substrate.

2. The apparatus of claim 1, wherein the plurality of conductive pins accommodates probing of electrical resistance of 2D semiconductor materials of the substrate along the carving shapes thus providing individual sensing of current-voltage characteristics per each carving shape of the carving shapes.

3. The apparatus of claim 1, wherein based on an aspect ratio associated with a first carving shape of the carving shapes, measurements of a total resistance is dominated by material Resistivity ($\rho$) after a threshold length of the first carving shape.

4. The apparatus of claim 1, wherein the carving shapes define different aspect ratios and accommodate testing of the integrality of the relationship between resistivity and a length (L) of each of the carving shapes expected to be inversely proportional ($\rho \sim 1/L$).

5. The apparatus of claim 1, further comprising a plurality of switches defined along the plurality of members.

6. The apparatus of claim 1, wherein the substrate is two-dimensional layered semiconductor material.

7. The apparatus of claim 1, wherein each of the plurality of members defines a different length from the free end to the body.

8. The apparatus of claim 1, wherein the body includes a carving enclosure that at least partially encloses the plurality of conductive pins.

9. The apparatus of claim 1, wherein the at least one electrical property includes an extraction of resistivity values associated with each of the plurality of conductive pins.

10. The apparatus of claim 1, wherein each of the plurality of members defines a different width from the free end to the body.

11. An apparatus, comprising:

a body;

a plurality of members extending from the body, the plurality of members including a first side in communication with the body and a second side opposite the first side defining a free end, each of the plurality of members defining a different respective geometric shape configuration;

a plurality of punching tips, each of the plurality of members defining a respective one of the plurality of punching tips along the free end and configured to form carving shapes corresponding to the respective geometric shape configuration;

a plurality of conductive pins, each of the plurality of members including a respective one of the plurality of conductive pins positioned relative to the body in accordance with the respective geometric shape configuration; and at least one conductive layer configured to electrically connect the plurality of conductive pins with a current meter.

12. The apparatus of claim 11, wherein the plurality of conductive pins accommodates probing of electrical resistance of 2D semiconductor materials of a substrate along the carving shapes thus providing individual sensing of current-voltage characteristics per each carving shape of the carving shapes.

13. The apparatus of claim 11, wherein based on an aspect ratio associated with a first carving shape of the carving shapes, measurements of a total resistance is dominated by material Resistivity ($\rho$) after a threshold length of the first carving shape.

14. The apparatus of claim 11, wherein the carving shapes define different aspect ratios and accommodate testing of the integrality of the relationship between resistivity and a length (L) of each of the carving shapes expected to be inversely proportional ($\rho \sim 1/L$).

15. The apparatus of claim 11, further comprising a plurality of switches defined along the plurality of members.

16. The apparatus of claim 11, further comprising substrate defining a two-dimensional layered semiconductor material.

17. The apparatus of claim 11, wherein each of the plurality of members defines a different length from the free end to the body.

18. The apparatus of claim 11, wherein the body includes a carving enclosure that at least partially encloses the plurality of conductive pins.

19. The apparatus of claim 11, wherein the at least one electrical property includes an extraction of resistivity values associated with each of the plurality of conductive pins.

* * * * *